United States Patent
Vinh et al.

(10) Patent No.: US 6,249,147 B1
(45) Date of Patent: Jun. 19, 2001

(54) METHOD AND APPARATUS FOR HIGH SPEED ON-CHIP SIGNAL PROPAGATION

(75) Inventors: James Vinh; Nital P. Patwa, both of San Jose, CA (US)

(73) Assignee: Fujitsu, Ltd., Kanagawa-Ken (JP)

( * ) Notice: Subject to any disclaimer, the term of this patent is extended or adjusted under 35 U.S.C. 154(b) by 0 days.

(21) Appl. No.: 09/265,289

(22) Filed: Mar. 9, 1999

(51) Int. Cl.[7] ............................................. H03K 19/0185

(52) U.S. Cl. .................................. 326/86; 326/28; 326/83

(58) Field of Search ............................... 328/23, 26–28, 328/83, 86; 327/374, 376, 377

(56) References Cited

U.S. PATENT DOCUMENTS

| | | |
|---|---|---|
| 3,819,877 | 6/1974 | Blahut et al. . |
| 4,012,593 | 3/1977 | Yamaguchi . |
| 4,091,386 | 5/1978 | Luedtke et al. . |
| 4,096,566 | 6/1978 | Borie et al. . |
| 4,154,978 | 5/1979 | Tu . |
| 4,387,466 | 6/1983 | Sire . |
| 4,512,016 | 4/1985 | Fulcomer, Jr. et al. . |
| 4,584,441 | 4/1986 | Chance et al. . |
| 4,591,669 | 5/1986 | Duttweiler et al. . |
| 4,598,410 | 7/1986 | Smith et al. . |
| 4,604,576 | 8/1986 | Barrault . |
| 4,628,157 | 12/1986 | Chance et al. . |
| 4,635,260 | 1/1987 | Sestan . |
| 4,658,396 | 4/1987 | Barden . |
| 4,779,013 * | 10/1988 | Tanaka ..................... 326/83 |
| 4,847,831 | 7/1989 | Spiesman et al. . |
| 5,414,312 | 5/1995 | Wong ....................... 326/83 |
| 5,475,605 | 12/1995 | Lin ........................ 364/488 |
| 5,497,108 | 3/1996 | Menon et al. ............ 326/84 |
| 5,546,083 | 8/1996 | Elam . |

(List continued on next page.)

FOREIGN PATENT DOCUMENTS

| | | | |
|---|---|---|---|
| 0 675 601 A1 | 10/1995 | (EP) | ............................ H03K/19/017 |
| 98 42021 A | 9/1998 | (WO) | ........................... H01L/21/822 |

OTHER PUBLICATIONS

Patent Abstracts of Japan. vol. 017, No. 202 (E–1353), Apr. 20, 1993 & JP 04 345062 A (Fujitsu Ltd.), Dec. 1, 1992 [abstract].

*Primary Examiner*—Michael Tokar
*Assistant Examiner*—Don Phu Le
(74) *Attorney, Agent, or Firm*—Fenwick & West LLP

(57) ABSTRACT

An apparatus for high speed signal propagation across a net in an integrated circuit operates with a driver that is coupled to the net, for driving signals across the net. A first transition assist driver (TAD) is coupled to a first node in the net and is capable of pulling the voltage level of the first node in response to the voltage level of the first node reaching a threshold value. The threshold value can be adjusted in order to increase the switching speed or, alternatively, the noise immunity of the first TAD. A second TAD is coupled to a second node in the net and is capable of pulling the voltage level of the second node in response to the voltage level of the second node reaching the threshold value. The apparatus is used for increasing the propagation speed of signals that are transmitted in a microprocessor block or other stages in an integrated circuit. A method for high speed signal propagation in an integrated circuit by use of a signal propagation system includes the steps of: (a) sensing a voltage level of a first node in a net; and (b) pulling the voltage level of the first node in response to the voltage level of the first node reaching a threshold value. This method is applicable without any modification when the net can be driven by one of the multiple drivers attached to the net. In other words, the method allows bi-directional signal propagation.

59 Claims, 7 Drawing Sheets

U.S. PATENT DOCUMENTS

| | | | |
|---|---|---|---|
| 5,568,064 | 10/1996 | Beers et al. | 326/31 |
| 5,572,441 | 11/1996 | Boie | 364/514 R |
| 5,578,939 | 11/1996 | Beers et al. | 326/30 |
| 5,604,450 | 2/1997 | Borkar et al. | 326/82 |
| 5,629,860 | 5/1997 | Jones et al. | 364/490 |
| 5,649,170 | 7/1997 | Chappell et al. | 395/500 |
| 5,655,107 | 8/1997 | Bull | 395/500 |
| 5,659,575 | 8/1997 | Vielhaber et al. | 375/213 |
| 5,668,482 * | 9/1997 | Roskell | 326/86 |
| 5,715,405 * | 2/1998 | McClear et al. | 395/280 |
| 5,723,906 | 3/1998 | Rush | 257/723 |
| 5,734,334 | 3/1998 | Hsieh et al. | 340/827 |
| 5,742,181 | 4/1998 | Rush | 326/41 |
| 5,748,487 | 5/1998 | Sawasaki et al. | 364/489 |
| 5,761,081 | 6/1998 | Tomita et al. | 364/490 |
| 5,933,021 * | 8/1999 | Mohd | 326/34 |
| 6,069,496 * | 5/2000 | Perez | 326/98 |

* cited by examiner

METHOD AND APPARATUS FOR HIGH SPEED ON-CHIP SIGNAL PROPAGATION

FIELD OF THE INVENTION

The present invention relates generally to the field of data transmission, and more particularly to an apparatus and method for increasing the propagation speed of a signal along signal paths in an integrated circuit.

BACKGROUND OF THE INVENTION

The signal propagation delay time increases as the signal path length through a network increases. The propagation delay time is also relatively higher for a signal transmitting across a "heavily-loaded" network (i.e., a network or net with a large capacitive load), since the large capacitive load increases the RC delay time of the propagating signal. One example of a heavily-loaded net is an SRAM word line.

As feature sizes decrease, the metal layers in integrated circuits increase in resistance value. The higher resistance values increase the RC delay for signals transmitting across the nets formed in the metal layers.

The microprocessor cycle time increases if the propagation delay time increases for signals processed by the microprocessor. Additionally, timing requirements in "critical nets" ("critical paths") may also not be met if signal propagation delay time increases along a critical net.

According to conventional approaches, repeaters, normally in the form of inverters, may be inserted in a long net to increase the signal propagation speed. The repeaters divide the long net into multiple shorter-length nets wherein each repeater drives one of the shorter length nets. In many instances, the desired signal timing (or optimized timing) is attained by insertion of an odd number of inverters. However, the odd number of inverters reverses the polarity (voltage swing) of the propagating signal. To obtain the original polarity of the propagating signal, an additional inverter is inserted in the net so that an even number of inverters is implemented. However, the additional inverter adds delay and, as a result, the desired signal timing constraint (or optimized timing value) may not be satisfied for the net.

Conventional approaches also have the "neighbor effect" problem. The neighbor effect occurs when signals propagating along neighboring nets switch in opposite directions. The neighbor effect leads to a higher effective switching capacitance that also increases the signal propagation delay time.

Accordingly, it is desirable to provide a method and apparatus that can increase the propagation speed of a signal across a net in an integrated circuit and that can overcome the above mentioned deficiencies of conventional approaches.

An important case of the RC delay problem is a net driven by one of the multiple drivers attached to the net. The net cannot use repeaters because repeaters, being unidirectional, disallow the drivers to reach all portions of the net. An example of such net is the result bus of a multiple functional unit. It is desirable to provide a method and apparatus that improve the propagation delay in this case. The conventional approach to solve this case is the use of a bi-directional repeater. However the bi-directional repeater is slow and requires a control circuit to direct the direction of the signal flow. The control circuit is likely to not only be costly in terms of area, but also can introduce speed problems by itself.

SUMMARY OF THE INVENTION

The present invention provides an apparatus for achieving high speed signal propagation across a net driven by one of the multiple drivers in an integrated circuit. The apparatus includes a first driver for driving a signal across the net. A first transition assist driver (TAD) can pull the voltage level at a first node in the net in response to the voltage level at the first node reaching a threshold value as the signal approaches the first node. If the first node is precharged to a voltage level of logic level one, the first TAD can pull the voltage level of the first node to logic level zero. If the first node is precharged to a voltage level of logic level zero, the first TAD can pull the voltage level of the first node to logic level one. When the first TAD pulls the voltage level of the first node, the propagation speed of the signal across the net increases.

In another aspect of the present invention, a second TAD is coupled to the net at a second node and is capable of pulling the voltage level of the second node as the signal approaches the second node. By pulling the voltage level of the second node, the propagation speed of the signal is increased further. Additional TADs may be coupled to other nodes in the net to further increase the propagation speed of the signal across the net.

In another aspect of the present invention, the above threshold value can be adjusted by programming a TAD in accordance with the invention so that the switching speed or, alternatively, the noise immunity of the TAD increases.

In conventional approaches, repeaters (inverters) are used to increase the signal propagation speed across the net. However, an odd number of repeaters reverses the polarity (voltage swing) of the propagating signal. The present invention advantageously avoids the use of repeaters for increasing the signal propagation speed across a net. In addition, a TAD in accordance with the present invention does not invert the polarity of the propagating signal.

In another aspect of the present invention, a precharge scheme is used wherein neighboring nets are precharged to a particular voltage level. This precharge scheme avoids the "neighbor effect" problem of conventional approaches, wherein the neighbor effect occurs when signals propagating along neighboring nets are switching in opposite directions. The neighbor effect problem leads to a higher effective switching capacitance that also increases the signal propagation delay time. In the precharge scheme of the present invention, signals along neighboring nets will not switch in opposite directions. Thus, when a signal in one net is switching in one direction, another signal in a neighboring net is either switching in the same direction or remains at its current polarity.

A second driver may be coupled to the net for driving signals that propagate in a direction opposite to the direction of the signals driven by the first driver. As a result, bi-directional signal transmission can occur in the signal propagation system in accordance with the present invention. Additional drivers can be inserted at various points in the net to permit bi-directional signal transmission across the net.

A TAD in accordance with the invention can pull the voltage level of an associated node in the net, irrespective of the propagation direction of a signal across the net. The TAD can automatically detect the change in the voltage level of an associated node due to a signal propagating across the net and can pull the voltage level of the associated node to increase the propagation speed of the signal.

DETAILED DESCRIPTION OF THE PREFERRED EMBODIMENTS

Figure 1:
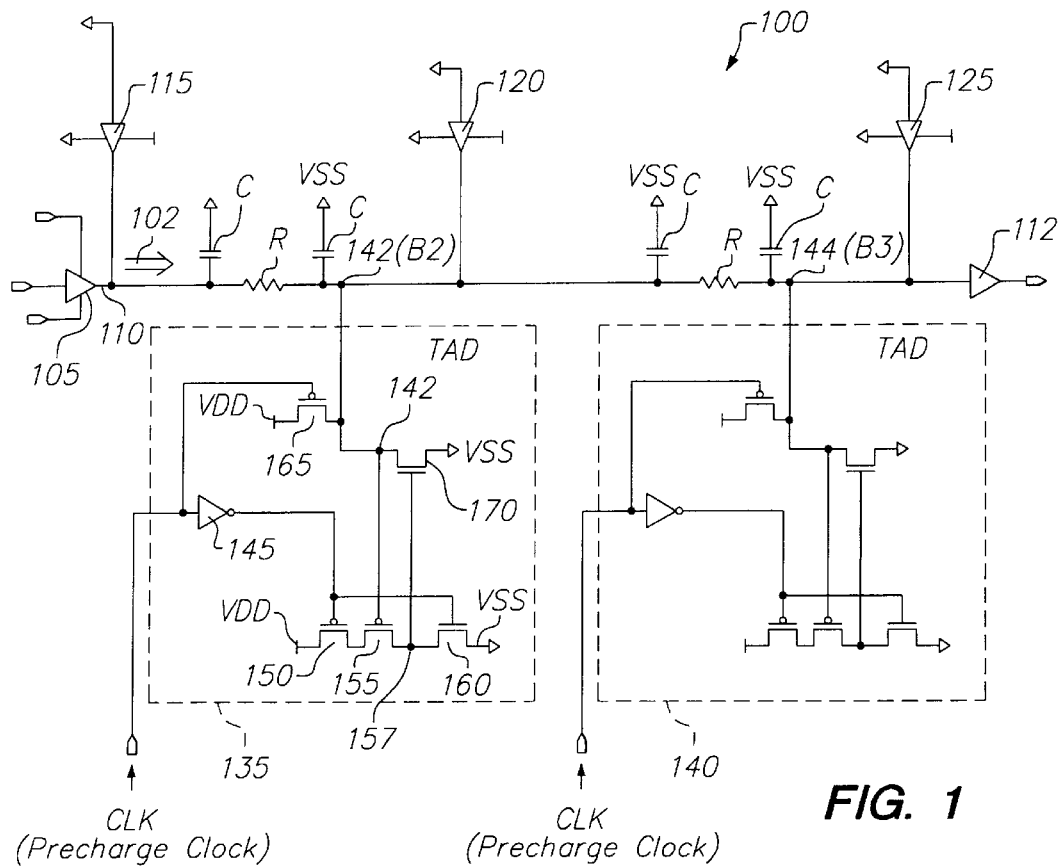
FIG. 1 is a schematic block diagram of a signal propagation system in accordance with a first embodiment of the present invention wherein transition assist drivers (TADs) increase the signal propagation speed.

Referring now to FIG. 1, there is shown a signal propagation system 100 in accordance with a first embodiment of the present invention. The signal propagation system 100 can increase the propagation speed of a signal 102 and can be implemented in an integrated circuit (not shown). For example, the signal propagation system 100 is used to transmit signals in a microprocessor (not shown). A driver 105 drives the signal 102 across a net (signal path) 110, and a receiver 112 receives the signal 102. The drivers 115, 120, and 125 are inactive or omitted if the signal propagation system 100 has a uni-directional signal transmission capability.

The distributed resistance and capacitance of the net 110 are shown as elements R and C, respectively. The capacitance C represents the capacitive characteristics and/or capacitive load of the net 110. The resistance R represents the resistive characteristics of the net 110 and increases in value as the length of the net 110 increases and/or as the width of the net 110 decreases.

The signal propagation system 100 further includes the transition assist drivers (TADs) 135 and 140 that are coupled to the net 110 at nodes 142 (or B2) and 144 (or B3), respectively. In one embodiment, the TAD 135 includes an inverter 145 with an input for receiving a precharge clock signal CLK and with an output coupled to the gate of a p-channel transistor 150. The p-channel transistor 150 has a source coupled to a positive voltage supply source such as VDD and a drain coupled to the source of a p-channel transistor 155. The p-channel transistor 155 has a drain coupled to a node 157 and a gate coupled to the net 110 via node 142. An n-channel transistor 160 has a drain coupled to the node 157, a source coupled to ground (VSS), and a gate coupled to the output of the inverter 145.

The TAD 135 further includes a p-channel transistor 165 with a gate for receiving the precharge clock signal CLK, a source coupled to VDD, and a drain coupled to the net 110 via node 142. An n-channel transistor 170 has a drain coupled to the net 110 via node 142, a source coupled to VSS, and a gate coupled to node 157.

In accordance with the present invention, the number of TADs connected to the net 110 may vary. Thus in an alternative embodiment not shown, only one TAD may be connected to the net 110. Alternatively, additional TADs, drivers, and/or receivers may be connected to the net 110 in the signal propagation system 100, as described below.

The use of the TAD 135 and/or TAD 140 increases the propagation speed of the signal 102 by increasing the rate of the voltage swing on the net 110. The TAD 135 and/or TAD 140 can increase the rate of the voltage swing resulting from signal 102 by pulling the voltage levels at nodes associated with the TADs 135 and 140, as described below. The TADs 135 and 140 can effectively compensate the decrease in signal propagation speed wherein the decrease in signal speed is due to line resistance and distributed capacitance. By coupling additional TADs to the net 110, the signal propagation speed across the net 110 can be increased further. Thus, the propagation delay of a signal can be minimized for longer-length nets or for nets with heavy capacitive loads.

Figure 2:
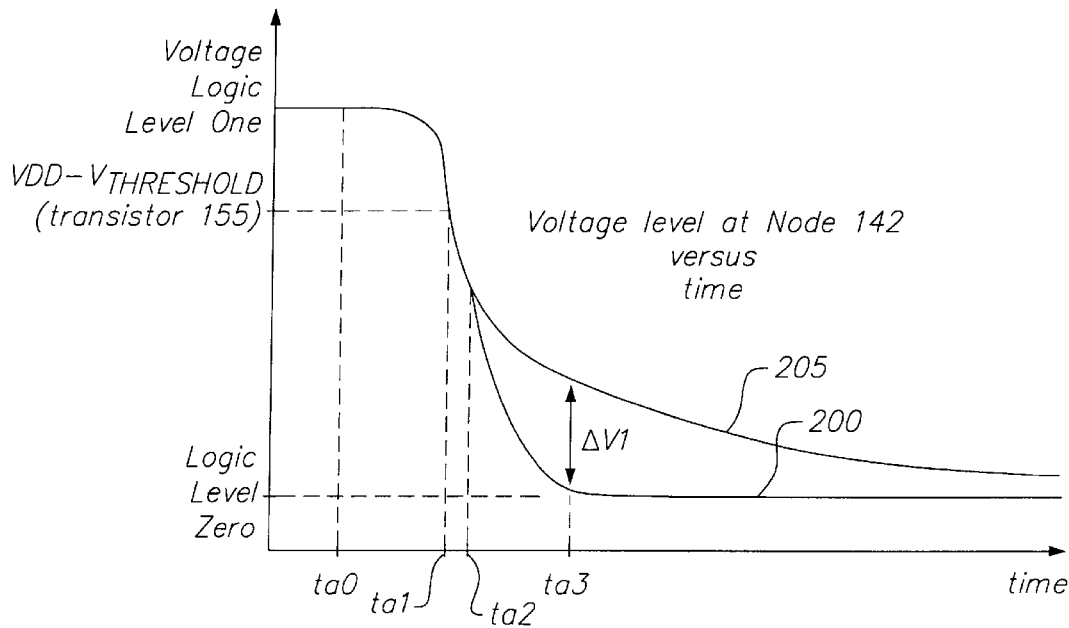
FIG. 2 is a graph showing a first waveform that represents the voltage swing at a particular node in the signal propagation system of FIG. 1 and a second waveform that represents the voltage swing at the same node without the assistance of a TAD.

Reference is now made to FIGS. 1 and 2 for discussion of the operation of the signal propagation system 100. In particular, FIG. 2 shows a first waveform 200 that represents the voltage swing at node 142 in the net 110 for different time periods. The waveform 205 represents the voltage swing at node 142 without the assistance of the TAD 135. During system power-up and/or system reset the net 110 is precharged to a logic level one voltage value, as shown at time ta0 in FIG. 2. The logic level one value may be, for example, about 1.8 volts. The precharge clock signal CLK has a logic level zero value when the net 110 is being precharged to logic level one. Since the precharge clock signal CLK is low during the precharge of net 110, the p-channel transistor 165 is on. Thus, the p-channel transistor 165 pulls the node 142 to the VDD voltage level, thereby permitting the net 110 to be precharged to VDD (logic level one).

The node 142 is high prior to the evaluation period, since the net 110 is precharged high. Therefore, the p-channel transistor 155 is off prior to evaluation, since its gate is receiving the logic level one value from node 142.

During the precharge of net 110, the inverter 145 inverts the logic level zero value of the clock signal CLK to logic level one. The high output signal of inverter 145 is driven into the gates of p-channel transistor 150 and n-channel transistor 160. Thus, p-channel transistor 150 is off and n-channel transistor 160 is on during the precharge of net 110 and prior to the evaluation period. The node 157 is, therefore, pulled to VSS by n-channel transistor 160 during the precharge of net 110.

The user may then initiate the evaluation period by use of a conventional external control circuit (not shown) for switching the precharge clock signal CLK from logic level zero to logic level one. When the precharge clock signal CLK switches to logic level one, the p-channel transistor 165 turns off. The logic level one value of the precharge clock signal CLK is inverted to a logic level zero value by the inverter 145. Thus, the inverter 145 low output signal turns on the p-channel transistor 150 and turns off the n-channel transistor 160. At this time, the node 157 remains at the VSS voltage level.

In an alternative embodiment of the present invention, the precharge clock signal CLK may be generated by an on-chip (internal) clock source (not shown). The on-chip clock source will generate the precharge clock signal CLK which is then driven into the input of the inverter 145 and into the gate of p-channel transistor 165 (FIG. 1). Thus, the transitions of the precharge clock signal CLK determine the occurrence of the evaluation period.

After time ta0 (see FIG. 2), the driver 105 generates a signal 102 with a voltage swing to logic level zero. Due to the RC characteristics of the net 110, the magnitude of the voltage swing (from logic level one to logic level zero) across the net 110 is a function of time and distance. The magnitude of the voltage swing is greater at positions (in net 110) that are close to the driver 105.

Due to the signal 102 which is propagating across net 110, at time ta1, the voltage across node 142 falls from the precharge VDD value to a threshold value, VDD-$V_{threshold\ (transistor\ 155)}$. The VDD value equals, for example, about 1.8 volts. The $V_{threshold(transistor\ 155)}$ voltage is defined as the threshold voltage of the transistor 155. The value of $V_{threshold\ (transistor\ 155)}$ is typically equal to about 0.25 volts. The gate of the p-channel 155 receives the voltage at node 142. When the gate voltage of the p-channel transistor 155 falls to about VDD-$V_{threshold(transistor\ 155)}$, the transistor 155 turns on. Thus, the p-channel transistors 150 and 155 are both on and will pull node 157 from the VSS level to VDD (logic level one) and n-channel transistor remains off.

Since the node 157 is pulled to VDD, the n-channel transistor 170 turns on at time ta2 (FIG. 2). Thus, the n-channel transistor 170 pulls the node 142 to VSS (logic level zero) at time ta3, thereby completing the voltage swing of node 142 from logic level one to logic level zero.

As shown in FIG. 2, the TAD 135 permits the voltage level at node 142 to be pulled down by an additional ΔV1 voltage value at time ta3. Without the assistance of the TAD 135, the voltage swing at node 142 is slower in rate, as shown by the waveform 205. For longer-length or heavily-loaded nets, the voltage swing at node 142 is decreased further in rate without the assistance of the TAD 135.

As the signal 102 propagates across the net 110, other TADs (such as TAD 140) assist in pulling down other nodes in the net 110 to logic level zero. As a result, the propagation speed of the signal 102 increases further across the net 110.

In conventional approaches, repeaters (inverters) are used to increase the signal propagation speed across the net. However, an odd number of repeaters reverses the polarity (voltage swing) of the propagating signal. The present invention advantageously avoids the use of repeaters for increasing the signal propagation speed across a net. In addition, a TAD in accordance with the present invention does not invert the polarity of the propagating signal.

In the precharge scheme of the present invention, neighboring nets are precharged to a particular voltage level (e.g., logic level one) prior to the evaluation period. This precharge scheme avoids the "neighbor effect" problem of conventional approaches, wherein the neighbor effect occurs when signals propagating along neighboring nets are switching in opposite directions. The neighbor effect problem leads to a higher effective switching capacitance that also increases the signal propagation delay time. In the precharge scheme of the present invention, signals along neighboring nets will not switch in opposite directions. Thus, when a signal in one net is switching in one direction, another signal in a neighboring net is either switching in the same direction or remains at its current polarity.

Figure 3:
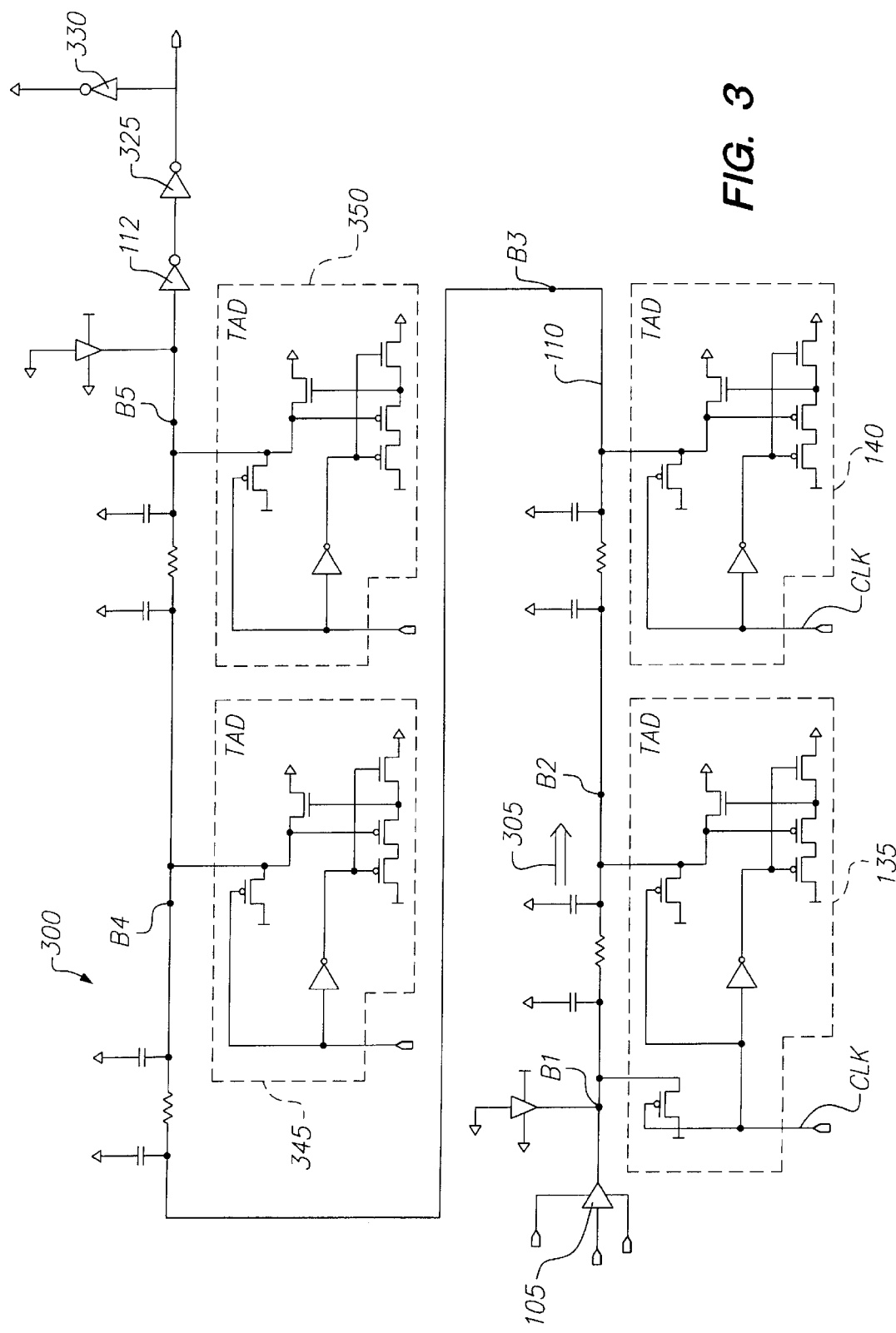
FIG. 3 is a schematic block diagram of a signal propagation system in accordance with a second embodiment of the present invention wherein the signal propagation system includes additional TADs.
Figure 4:
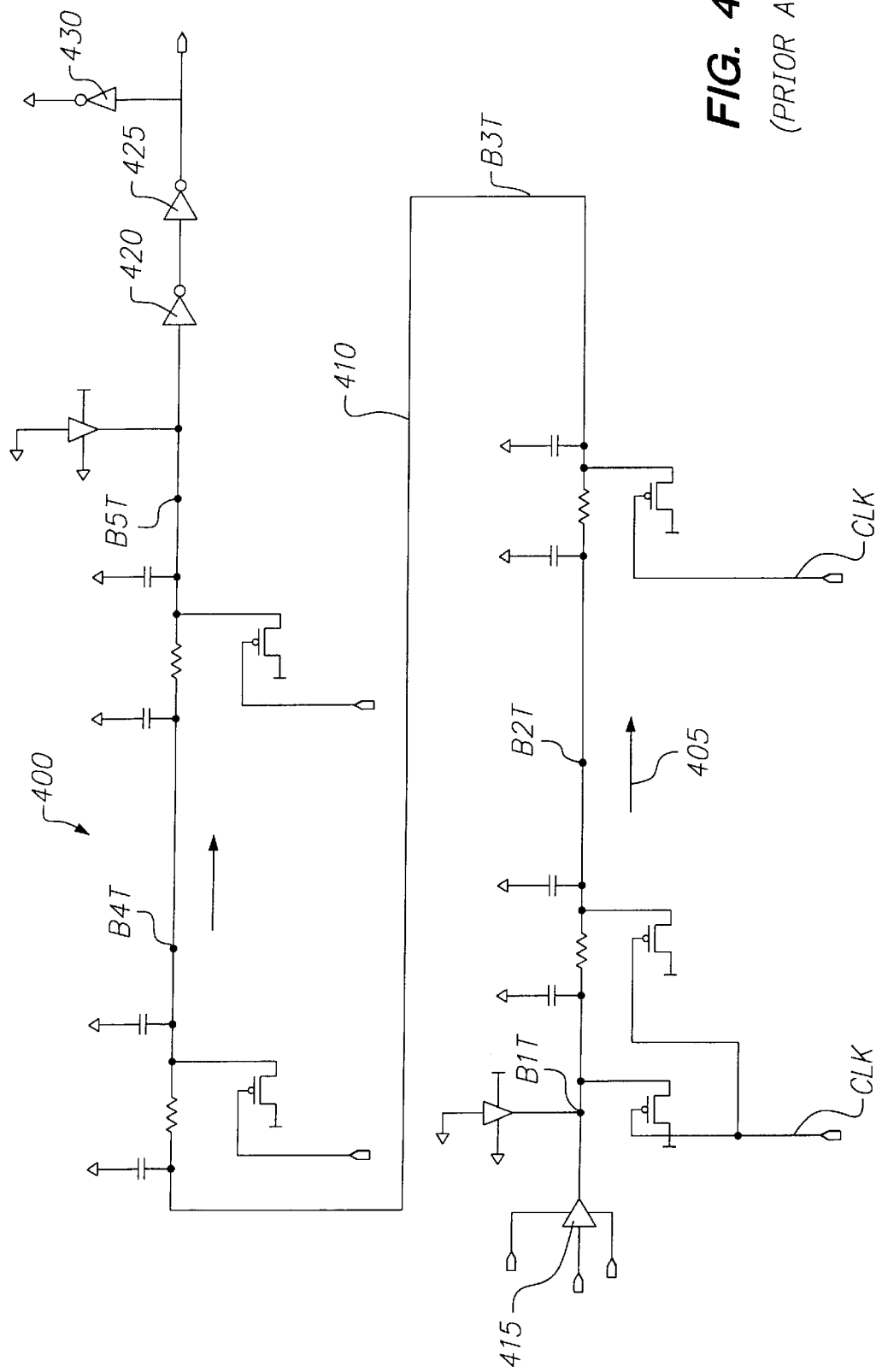
FIG. 4 is a schematic block diagram of a conventional signal propagation system.
Figure 5:
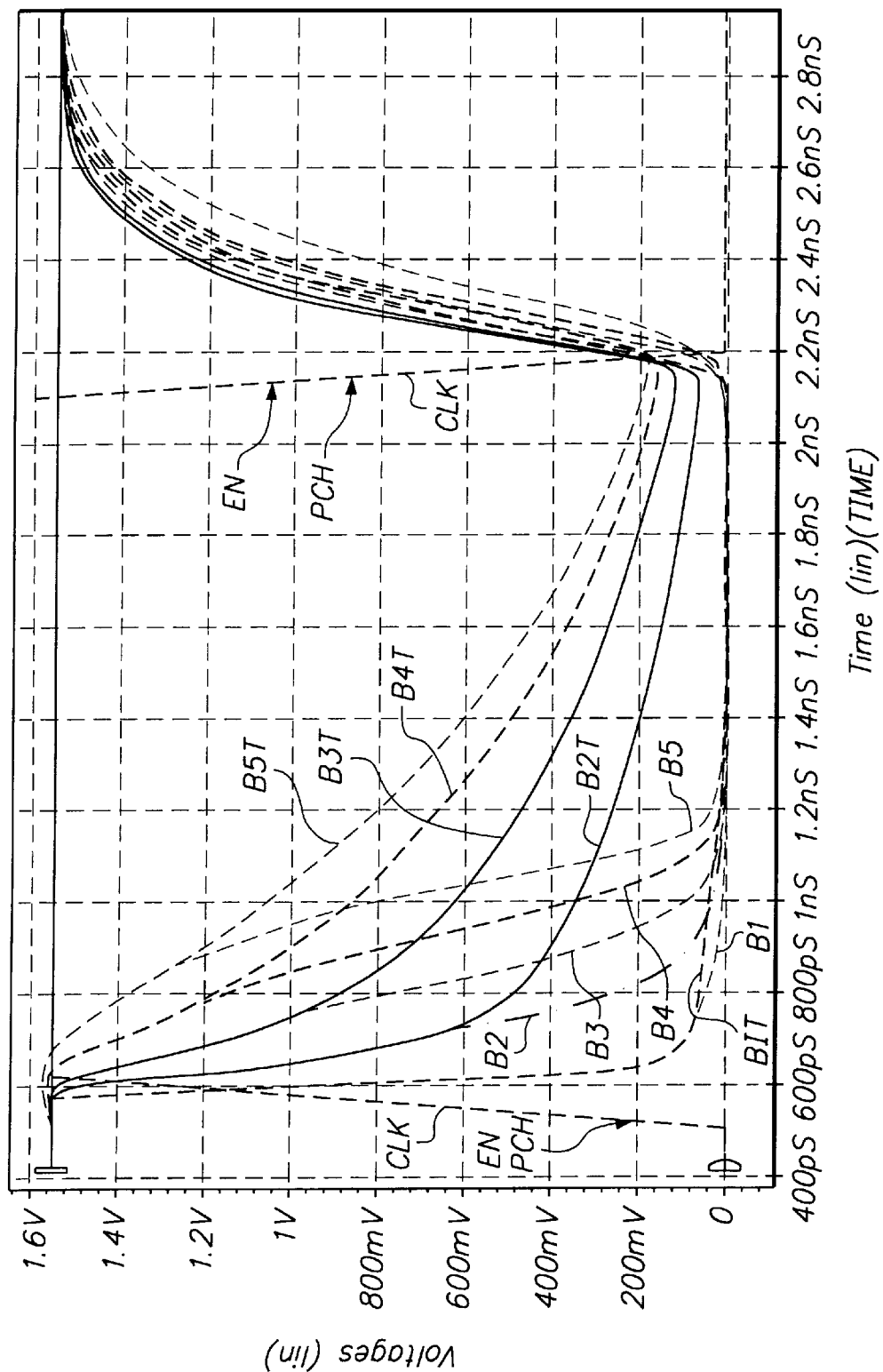
FIG. 5 is a graph showing various waveforms that represent voltage levels at different nodes in the signal propagation systems of FIG. 3 and FIG. 4.

Reference is now made to FIGS. 3, 4, and 5 to further illustrate the functionality of the present invention. FIG. 3 is a schematic block diagram of a signal propagation system 300 in accordance with a second embodiment of the present invention. The system 300 includes the receivers 112, 325, and 330 for receiving the signal 305. The TADs 135, 140, 345, and 350 are coupled to the net 110 at the nodes B2, B3, B4, and B5, respectively. The TADs 135, 140, 345, and 350 each pulls the voltage level of their associated nodes when the voltage level at an associated node reaches a threshold value (e.g., VDD-$V_{threshold}$ wherein $V_{threshold}$ equals, for example, about 0.25 volts).

Referring now to FIG. 4, there is shown a conventional signal propagation system 400 for transmitting a signal 405 across the net 410. A driver 415 drives the signal 405 for reception by the receivers 420, 425, and 430. The signal 405 propagates across the nodes B1T–B5T in the net 410 before being received by the receiver 420.

FIG. 5 is a graph that compares the voltage levels at nodes B1–B5 in net 110 with the voltage levels at nodes B1T–B5T in net 410 for particular time periods. The TADs 135, 140, 345, and 350 assist in pulling down the nodes B2, B3, B4, and B5, respectively, from logic level one to logic level zero. As a result, the voltage swing from logic level one to logic level zero is faster at nodes B2–B5 than the voltage swing at nodes B2T–B5T. For example, the voltage level at node B5 is pulled down to logic level zero (0.0 volts) at about 1.2 nano-seconds after the start of the evaluation period (see FIG. 5). In contrast, the voltage level at node B5T is pulled down to a minimum voltage level of 200 millivolts at about 2.2 nano seconds after the start of the evaluation period. The evaluation period starts when the precharge clock signal rises to logic level one, as shown in FIG. 5. The faster rate of the voltage swings at nodes B2–B5 is due to the assistance provided by the TADs 135, 140, 345, and 350, respectively. The faster rate of the voltage swings at nodes B2–B5, therefore, results in a faster propagation speed for the signal 305 across the net 110.

Figure 6:
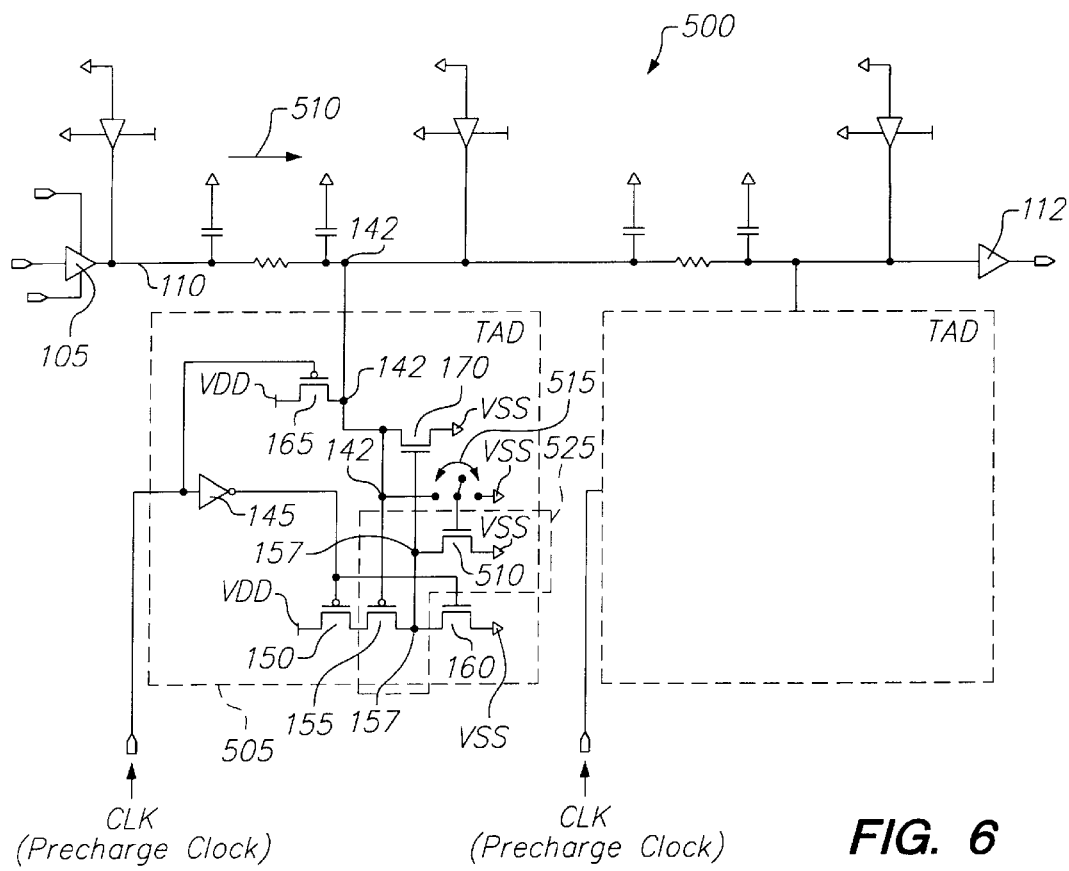
FIG. 6 is a schematic block diagram of a signal propagation system in accordance with a third embodiment of the present invention wherein the signal propagation system includes a programmable TAD that can trade off between faster switching speed and greater noise immunity.

FIG. 6 is a schematic block diagram of a signal propagation system 500 in accordance with a third embodiment of the present invention. The signal propagation system 500 includes a programmable TAD 505 that can trade off between a faster switching speed and greater noise immunity. The programmable TAD 505 may be coupled to the net 110 at node 142. The programmable features of the TAD 505 depend on the connection of an n-channel transistor 510 in the TAD circuitry. In particular, the n-channel transistor 510 has a drain connected to the node 157 and a source connected to VSS. The gate of the n-channel transistor 510 may be connected to node 142 or alternatively connected to VSS, as symbolized by the double headed arrow 515. The gate of the n-channel transistor 510 is connected to node 142 or to VSS by altering a final metal layer (not shown) of an integrated circuit chip (not shown) that includes the TAD 505.

Case 1: The gate of n-channel transistor 510 is connected to VSS.

When the gate of the n-channel transistor 510 is connected to VSS, then the n-channel transistor 510 is effectively disconnected from the circuitry of the TAD 505. As a result, the TAD 505 functions in a similar manner as the TAD 135 in FIG. 1 and will be capable of high speed switching for pulling node 142 from logic level one to logic level zero. Assume that VDD is equal to about 1.8 volts and the threshold voltage of the p-channel transistor 155 ($V_{threshold\ (transistor\ 155)}$) is about 0.25 volts. When the voltage level at the gate of p-channel transistor 155 (or at node 142) falls to $VDD - V_{threshold(transistor\ 155)} = 1.8$ volts $- 0.25$ volts $= 1.55$ volts, then the p-channel transistor 155 turns on. Since the p-channel transistors 150 and 155 are on while the n-channel transistor 160 remains off, the node 157 is pulled from the VSS level to the VDD level. The n-channel transistor 170 will then turn on since it is receiving the VDD voltage level from node 157. Since the n-channel transistor 170 is on, the node 142 is pulled to VSS (logic level zero). Thus, when the gate of n-channel transistor 510 is connected to VSS, the TAD 505 will start switching and thereby pull node 142 to logic level zero in response to the voltage level at node 142 falling to a threshold value of, for example, 1.55 volts.

Case 2: The gate of n-channel transistor 510 is connected to node 142.

When the gate of the n-channel transistor 510 is connected to node 142, then the transistors 155 and 510 form an inverter 525 having an input at node 142 and an output at node 157. The switching voltage VSW of the inverter 525 is typically kept at about (⅔)VDD=1.2 Volts. Thus, when the node 142 falls to a voltage level of about (⅔)VDD=1.2 volts, the inverter 525 will switch the node 157 to a logic level one voltage level. Since node 157 is switched high, the transistor 170 turns on, thereby pulling node 142 to VSS (logic level zero) to complete the voltage swing of node 142 from logic level one to logic level zero.

By connecting the gate of transistor 510 to node 142, a relatively lower voltage level of about 0.9 volts is required at node 142 before the TAD 505 assists in pulling the node 142 to logic level zero. As a result, the TAD 505 has greater immunity against noise. The TAD 505 is particularly useful in an environment having a high degree of noise or interference. The trade off for obtaining the greater immunity against noise is the relatively slower switching speed of the TAD 505, since the node 142 is required to fall to a relatively lower voltage level before the TAD 505 assists in pulling down the node 142.

Figure 7:
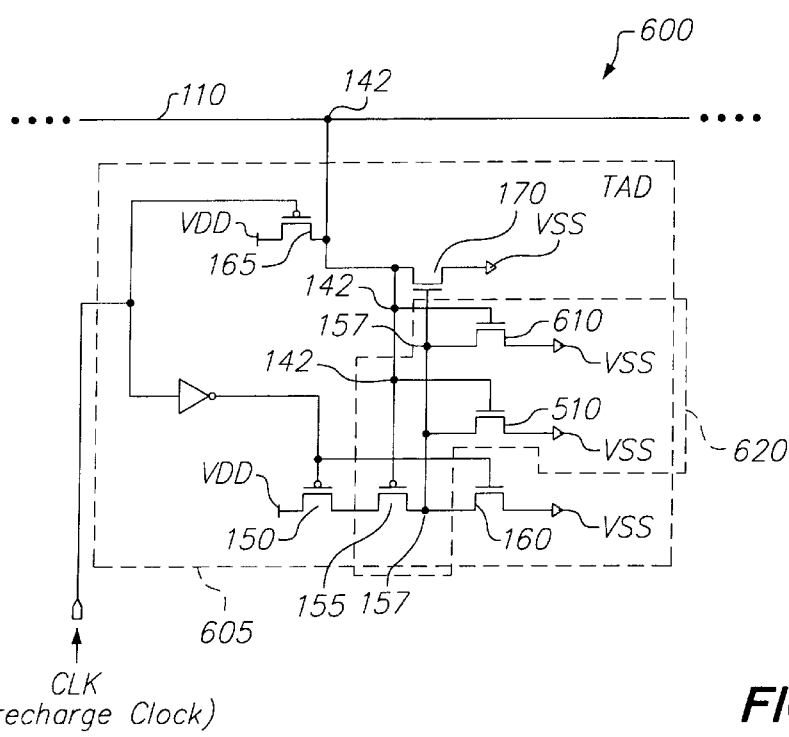
FIG. 7 is a partial view of a signal propagation system in accordance with a fourth embodiment of the present invention wherein the signal propagation system includes a programmable TAD with increased noise immunity features.

FIG. 7 is a partial view of a signal propagation system 600 in accordance with a fourth embodiment of the present invention. The signal propagation system 600 includes a programmable TAD 605 coupled to the net 110 at node 142. The programmability of TAD 605 is achieved by adding n-channel transistors (such as the n-channel transistor 610) in the TAD circuitry to further increase the noise immunity of the TAD 605. The n-channel transistor 610 has a gate connected to node 142, a drain connected to node 157, and a source connected to VSS. The p-channel transistor 155 and the parallel n-channel transistor pair 510 and 610 form an inverter 620 with an input at node 142 and an output at node 157. The parallel n-channel transistor pair 510 and 610 effectively form a larger size transistor within the inverter 620, thereby lowering the switching voltage VSW of inverter 620 to less than (⅔)VDD. Thus, the voltage at node 142 must fall to a value less than (⅔)VDD before the inverter 620 switches node 157 to logic level one to turn on transistor 170. When n-channel transistor 170 turns on, it pulls node 142 to VSS (logic level zero).

Additional n-channel transistors (not shown) may be connected to the circuitry of TAD 605 in a manner similar to the connection of the n-channel transistor 610. These additional n-channel transistors further increase the noise immunity of the TAD 605 by further decreasing the value of the switching voltage VSW of inverter 620, typically in the range from about (⅔)VDD to about (½)VDD.

Figure 8:
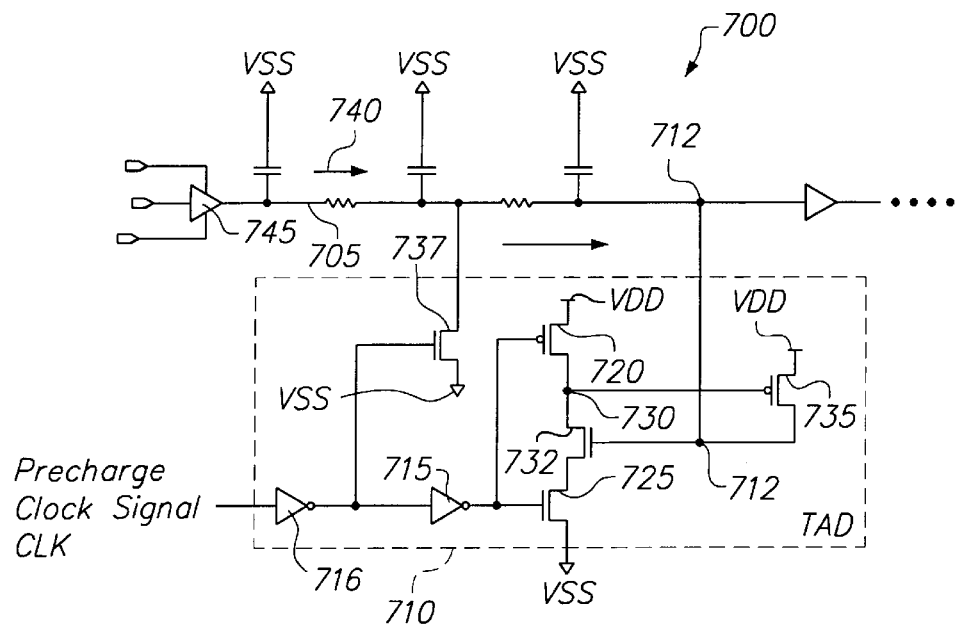
FIG. 8 is a schematic block diagram of a signal propagation system in accordance with a fifth embodiment of the present invention wherein a TAD is coupled to a net that is precharged to logic level zero during system power-up and/or system reset.

FIG. 8 is a schematic block diagram of a signal propagation system 700 in accordance with a fifth embodiment of the present invention wherein a net 705 is precharged to logic level zero during system power-up and/or system reset. A TAD 710 is coupled to the net 705 via node 712 and comprises an inverter 715 with an output coupled to the gates of a p-channel transistor 720 and an n-channel transistor 725. The input of inverter 715 is coupled to the output of an inverter 716. The input of inverter 716 receives the precharge clock signal CLK.

The p-channel transistor 720 has a source coupled to VDD and a drain coupled to a node 730. An n-channel transistor 732 has a drain connected to the node 730, a source connected to the drain of n-channel transistor 725, and a gate connected to node 712. The n-channel transistor 725 has a source connected to VSS.

A p-channel transistor 735 has a source connected to VDD, a drain connected to node 712, and a gate connected to node 730. An n-channel transistor 737 has a drain connected to the net 705, a source connected to VSS, and a gate coupled to the output of inverter 716.

Figure 9:
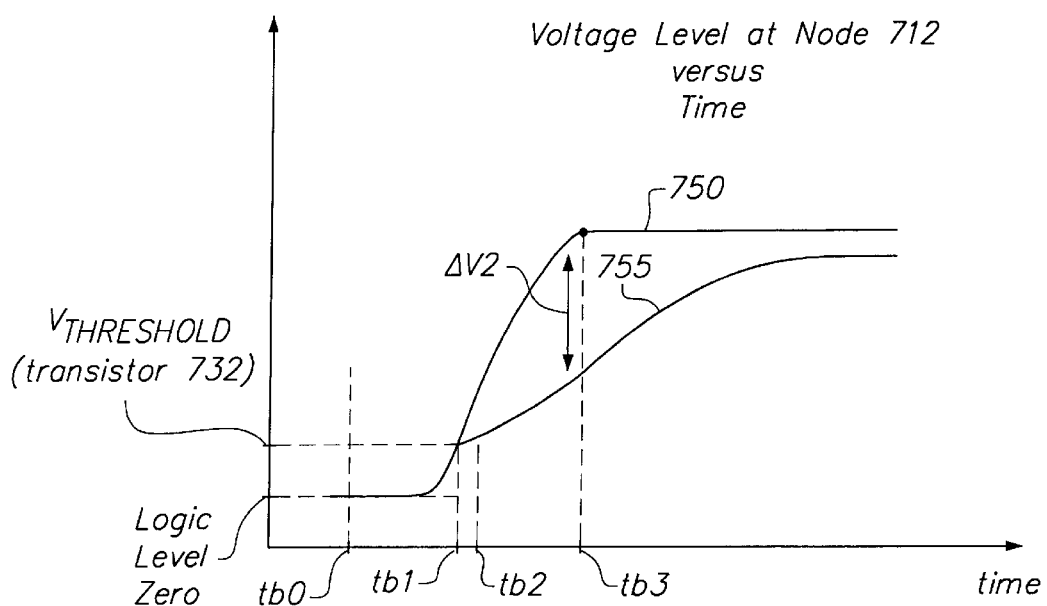
FIG. 9 is a graph showing a first waveform that represents the voltage swing at a node in the signal propagation system of FIG. 8 and a second waveform that represents the voltage swing at the same node without the assistance of a TAD.

Reference is now made to FIGS. 8 and 9 for discussion of the operation of the TAD 710. In FIG. 9, the waveform 750 represents the voltage swing at node 712 for different time periods with the assistance of the TAD 710. The waveform 755 represents the voltage swing at node 712 for different time periods without the assistance of the TAD 710. At time tb0, the net 705 and node 712 are precharged to logic level zero. The precharge clock signal CLK has a logic level zero value when the net 705 is being precharged to logic level zero. The low clock signal CLK is inverted into a logic level one signal by inverter 716. The logic level one output signal from inverter 716 turns on n-channel transistor 737. Thus, the n-channel transistor 737 pulls the voltage level of net 705 to VSS (logic level zero) during precharge and prior to the evaluation period.

During the precharge of net 705, the inverter 715 also inverts the high output signal of inverter 716 into a logic level zero signal. The low output signal of inverter 715 is driven into the gates of p-channel transistor 720 and n-channel transistor 725. Thus, p-channel transistor 720 is on and n-channel transistor 725 is off. The n-channel transistor 732 is also off, since the gate of n-channel transistor 732 is coupled to node 712 which has been precharged low. Since p-channel transistor 720 is on, it pulls the node 730 to the VDD level during precharge of net 705 and prior to evaluation.

The user may then initiate the evaluation period by use of a conventional external control circuit (not shown) for switching the precharge clock signal CLK from logic level zero to logic level one. When the precharge clock signal CLK switches to logic level one during the start of the evaluation period, the output of the inverter 716 will be a logic level zero signal. The low output signal of inverter 716 turns off the n-channel transistor 737 and is inverted into a logic level one signal by inverter 715. The inverter 715 high output signal turns off the p-channel transistor 720 and turns on the n-channel transistor 725. At this time, the node 730 remains at the VDD level.

Assume after time tb0 that the tri-state driver 745 generates a signal 740 with a voltage swing to logic level one. At time tb1, the voltage level at node 712 rises to the threshold voltage of n-channel transistor 732 (i.e., $V_{threshold(transistor\ 732)}$), thereby turning on the n-channel transistor 732. The value of $V_{threshold(transistor\ 732)}$ is typically about 0.25 volts. Since transistors 725 and 732 are on and transistor 720 is off, transistors 725 and 732 will pull the node 730 from the VDD voltage level to the VSS ground voltage level. Since node 730 is pulled low, the p-channel transistor 735 turns on at time tb2 since its gate is receiving the VSS ground voltage value at node 730. At time tb3, the p-channel transistor 735 pulls the node 712 to VDD (logic level one), thereby completing the voltage swing of node 712 from logic level zero to logic level one.

As shown in FIG. 9, the TAD 710 increases the rate of the voltage swing at node 712. For example, at time tb3 the waveform 750 is ΔV2 higher in voltage value than the waveform 755.

Figure 10:
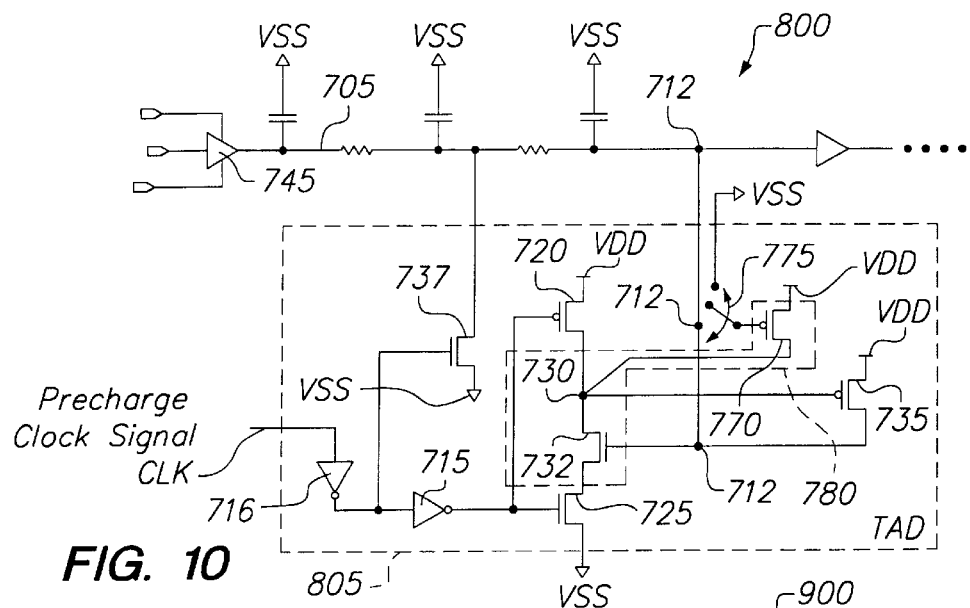
FIG. 10 is a schematic block diagram of a signal propagation system in accordance with a sixth embodiment of the present invention wherein the signal propagation system includes a programmable TAD that can trade off between faster switching speed and greater noise immunity.

FIG. 10 is a schematic block diagram of a signal propagation system 800 in accordance with a sixth embodiment of the present invention wherein the net 705 is precharged to a logic level zero during system power-on and/or system reset. The signal propagation system 800 includes a programmable TAD 805 that is coupled to the net 705 via node 712. The TAD 805 includes a p-channel transistor 770 with a source connected to VDD, a drain connected to node 730, and a gate that can be connected to either the node 712 or to VSS, as symbolically shown by the double headed arrow 775.

When the gate of the p-channel transistor 770 is connected to VSS, the transistor 770 is effectively omitted from the circuitry of the TAD 805. Thus, the TAD 805 will operate in a similar manner as the TAD 710 in FIG. 8. In particular and as discussed above, the TAD 805 will assist in pulling up node 712 to VDD in response to the voltage level at node 712 rising to the threshold voltage of transistor 732, $V_{threshold\ (transistor\ 732)}$, which is typically about 0.25 volts.

When the gate of the p-channel transistor 770 is connected to the node 712, then the transistors 770 and 732 form an inverter 780 with an input coupled to node 712 and an output coupled to node 730 for driving the gate of the p-channel transistor 735. Assume that VDD equals about 1.8 volts. The inverter 780 will switch the voltage level at node 730 from logic level one to logic level zero when the voltage at node 712 rises to VSW=VDD/3=1.8/3=0.6 volts. It is understood, however, that the switching voltage VSW of the inverter 780 may be adjusted to other values (typically in the range (⅓)VDD to (½)VDD) by adding p-channel transistors (not shown) in parallel with the p-channel transistor 770.

A logic level zero voltage at node 730 turns on the p-channel transistor 735. The p-channel transistor 735 then pulls the node 712 to VDD (logic level one). The voltage swing of the node 712 is thus completed from logic level zero to logic level one.

The TAD 805 has greater noise immunity, since the TAD 805 will not assist in pulling up the node 712 to logic level one until the voltage at the node 712 rises to, for example, VDD/3. The trade off for greater noise immunity is a slower switching speed for the TAD 805.

In another embodiment not shown, additional p-channel transistors (not shown) can be connected to the circuitry of the TAD 805 in the same manner as the connection of the p-channel transistor 770. The additional p-channel transistors provide for greater noise immunity for the TAD 805 by increasing the switching voltage VSW of inverter 780.

Figure 11:
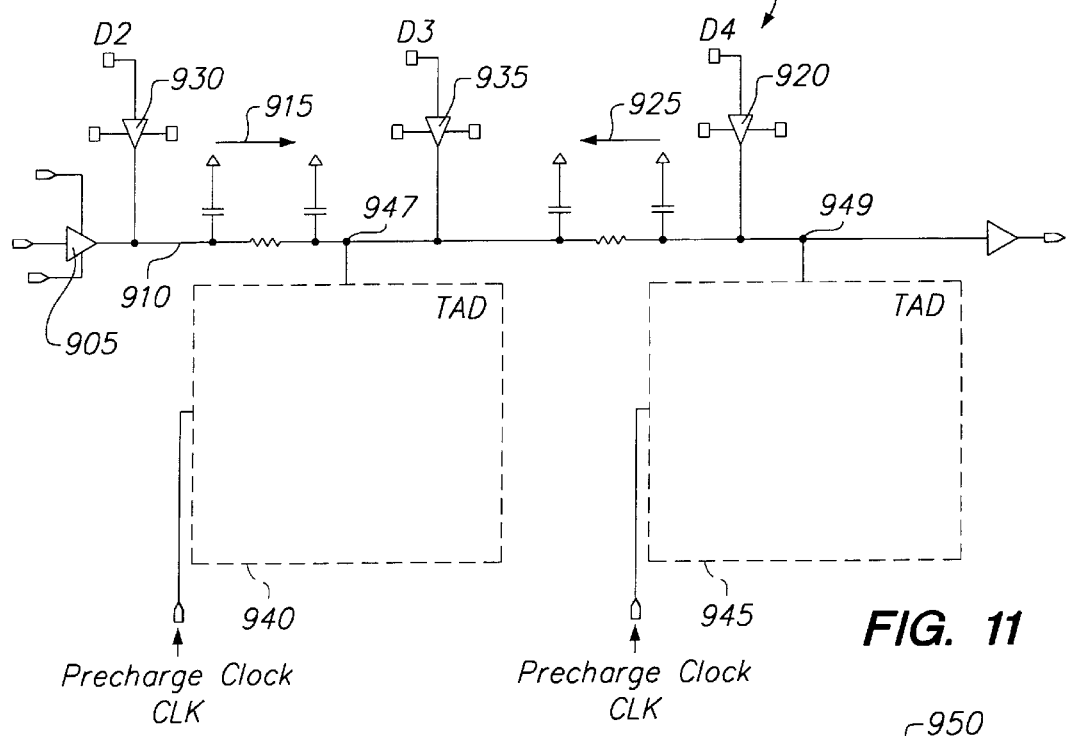
FIG. 11 is a schematic block diagram of a signal propagation system in accordance with a seventh embodiment of the present invention wherein multiple drivers are coupled to a net to permit bi-directional signal transmission across the net.

FIG. 11 is a schematic block diagram of a signal propagation system 900 in accordance with a seventh embodiment of the present invention wherein the system 900 has bi-directional signal transmission capabilities. For example, the driver 905 can drive a signal across the net 910 in the direction 915, while the driver 920 can drive a signal across the net 910 in the direction 925. Additional drivers (such as drivers 930 and 935) may be connected to the net 910 for also driving signals across the net 910.

The TADs 940 and/or 945 are connected to the net 910 to assist in increasing the propagation speed of signals across the net 910. In particular, the TADs 940 and 945 are connected to the net 910 at nodes 947 and 949, respectively. The number of TADs that are connected to the net 910 may vary. The TADs 940 and 945 are each capable of pulling the voltage level at their associated nodes when the voltage level at a node reaches a threshold value due to a propagating signal across the net 910. If the net 910 is precharged to a low logic level during system power-on and/or system reset, the TADs 940 and 945 can pull the voltage levels at their associated nodes to logic level one. The TADs 940 and/or 945 may each be implemented by the various TAD embodiments previously mentioned above.

Each of the TADs 940 and 945 can increase the propagation speed of a signal traveling in direction 915 or increase the propagation speed of another signal traveling in the opposed direction 925. As a result, a driver can be placed at various locations along the net 910 to transmit signals with increased speed due to the assistance of the TADs.

Figure 12:
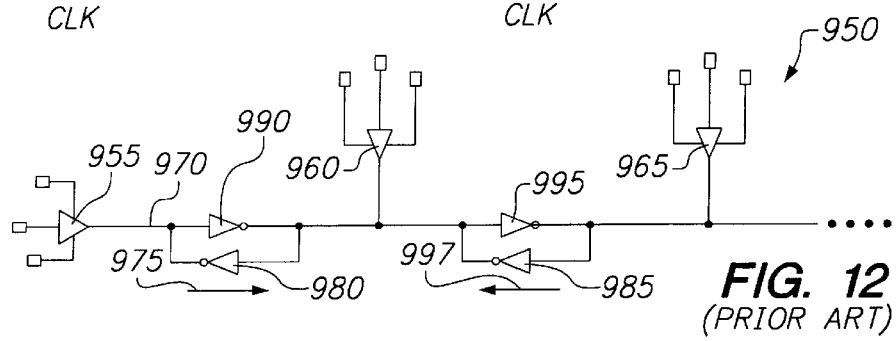
FIG. 12 is a schematic block diagram of a conventional signal propagation system that permits bi-directional signal transmission across the net.

In FIG. 12, a conventional system 950 with bi-directional signal transmission capabilities is shown. The conventional system 950 includes the drivers 955, 960, and 965 connected to the net 970 along various different nodes. Assume that the driver 955 can transmit a signal across the net 970 in the direction of 975. The conventional system 950 requires the repeaters 980 and 985 to be turned off if the driver 955 will transmit a signal. By turning off the repeaters 980 and 985, the signal in direction 975 can propagate across the repeaters 990 and 995. Alternatively, if the driver 965 will transmit a signal across the net 970 in the direction 997, then the repeaters 990 and 995 must be turned off, thereby permitting the signal in the direction 997 to propagate across the repeaters 980 and 985. Thus, in the conventional approach adjustments of the repeaters in the net is required, based upon the direction of the signal propagating across the net. In contrast, the present invention automatically increases the propagation speed of signals in the direction 915 or 925 (FIG. 11), without the need to make adjustments in the signal propagation system due to the different signal directions.

The various embodiments of the present invention beneficially increases the signal propagation speed in nets that are formed in integrated circuits. For example, various embodiments of the TADS discussed above can be connected to word lines in register files or word lines in re-order buffers. These word lines are relatively short conductors that are driven by a single driver and that have heavy capacitive loads that increase the propagation delay time of a signal.

The various embodiments of the TADs discussed above can also be connected to a microprocessor result bus. A result bus is driven by multiple drivers and, as a result, has bi-directional signal transmission capabilities.

The various embodiments of the TADs described above can also be connected to bit lines in a re-order buffer. These bit lines are driven by multiple drivers and, as a result, have bi-directional signal transmission capabilities. These bit lines are also relatively short conductors with heavy capacitive loads that increase the propagation delay time of a signal.

What is claimed is:

1. An apparatus for transmitting a signal across a net in an integrated circuit including a first node, the apparatus comprising:

a driver, coupled to the net, for driving the signal across the net;

a first transition assist driver (TAD) coupled to the first node in the net and capable of pulling the voltage level of the first node in response to the voltage level of the first node reaching a threshold value, wherein the first node is precharged to a first logic state, the first TAD pulling the first node to a second logic state in response to the voltage level of the first node reaching the threshold value.

2. The apparatus of claim 1 wherein the first TAD pulls the first node to logic level zero if the net is precharged to logic level one.

3. The apparatus of claim 1 wherein the first TAD pulls the first node to logic level one if the net is precharged to logic level zero.

4. The apparatus of claim 1 wherein the first TAD is capable of pulling the first node to logic level zero and comprises:

a first transistor having a first terminal coupled to the first node, a second terminal coupled to ground, and a gate terminal;

a second transistor having a first terminal coupled to a first supply voltage source, a second terminal, and a gate terminal for receiving an inverse of a precharge clock signal;

a third transistor having a first terminal coupled to the second terminal of the second transistor, a second terminal coupled to the gate terminal of the first transistor, and a gate terminal coupled to the first node; and a fourth transistor having a first terminal coupled to the second terminal of the third transistor, a second terminal coupled to ground, and a gate terminal for receiving the inverse of the precharge clock signal.

5. The apparatus of claim 4 wherein the first TAD further comprises:

a fifth transistor having a first terminal coupled to the gate terminal of the first transistor, a second terminal coupled to ground, and a gate terminal coupled to the first node and, alternatively, to ground.

6. The apparatus of claim 4 wherein the first TAD further comprises:

a sixth transistor having a first terminal coupled to the gate terminal of the first transistor, a second terminal coupled to ground, and a gate terminal coupled to the first node.

7. The apparatus of claim 4 wherein the first TAD further comprises:

a precharge transistor for precharging the net to logic level one, the precharge transistor having a first terminal coupled to the first supply voltage source, a second terminal coupled to the net, and a gate terminal for receiving the precharge clock signal.

8. The apparatus of claim 1 wherein the first TAD is capable of pulling the first node to logic level one and comprises:

a first pull-up transistor having a first terminal coupled to a first supply voltage source, a second terminal, and a gate terminal for receiving a precharge clock signal;

a first pull-down transistor having a first terminal coupled to the second terminal of the first pull-up transistor, a second terminal, and a gate terminal coupled to the first node;

a second pull-down transistor having a first terminal coupled to the second terminal of the first pull-down transistor, a second terminal coupled to ground, and a gate terminal for receiving the precharge clock signal; and a second pull-up transistor having a first terminal coupled to the first supply voltage source, a second terminal coupled to the first node, and a gate terminal coupled to the second terminal of the first pull-up transistor.

9. The apparatus of claim 8 wherein the first TAD further comprises:

a third pull-up transistor having a first terminal coupled to the first supply voltage source, a second terminal coupled to the second terminal of the first pull-up transistor, and a gate terminal that can be coupled to the first node and, alternatively, to ground.

10. The apparatus of claim 8 wherein the first TAD further comprises:

a fourth pull-up transistor having a first terminal coupled to the first supply voltage source, a second terminal coupled to the second terminal of the first pull-up transistor, and a gate terminal coupled to the first node.

11. The apparatus of claim 8 wherein the first TAD further comprises:

a precharge transistor for precharging the net to logic level zero, the precharge transistor having a first terminal coupled to the net, a second terminal coupled to ground, and a gate terminal for receiving an inverse of the precharge clock signal.

12. The apparatus of claim 1 further comprising:

a second driver capable of transmitting additional signals to permit bi-directional signal transmission across the net.

13. The apparatus of claim 1 further comprising:

a second TAD coupled to the net at a second node and capable of pulling the voltage level of the second node in response to the voltage level of the second node reaching a threshold value.

14. An apparatus for high speed signal propagation in an integrated circuit, comprising:

a net for transmitting signals in the integrated circuit, the net having a first node; and a first transition assist driver (TAD) coupled to a first node and capable of pulling the voltage level of the first node in response to the voltage level of the first node reaching a threshold value, wherein the first node is precharged to a first logic state, the first TAD pulling the first node to a second logic state in response to the voltage level of the first node reaching the threshold value.

15. The apparatus of claim 14 wherein the first TAD pulls the first node to logic level zero if the net is precharged to logic level one.

16. The apparatus of claim 14 wherein the first TAD pulls the first node to logic level one if the net is precharged to logic level zero.

17. The apparatus of claim 14 wherein the first TAD can increase the propagation speed of signals that propagate in a first direction across the net.

18. The apparatus of claim 14 wherein the first TAD can increase the propagation speed of signals that propagate in a second direction across the net.

19. The apparatus of claim 14 wherein the first TAD is capable of pulling the first node to logic level zero and comprises:
   a first transistor having a first terminal coupled to the first node, a second terminal coupled to ground, and a gate terminal;
   a second transistor having a first terminal coupled to a first supply voltage source, a second terminal, and a gate terminal for receiving an inverse of a precharge clock signal;
   a third transistor having a first terminal coupled to the second terminal of the second transistor, a second terminal coupled to the gate terminal of the first transistor, and a gate terminal coupled to the first node; and
   a fourth transistor having a first terminal coupled to the second terminal of the third transistor, a second terminal coupled to ground, and a gate terminal for receiving the inverse of the precharge clock signal.

20. The apparatus of claim 19 wherein the first TAD further comprises:
   a fifth transistor having a first terminal coupled to the gate terminal of the first transistor, a second terminal coupled to ground, and a gate terminal coupled to the first node and, alternatively, to ground.

21. The apparatus of claim 19 wherein the first TAD further comprises:
   a sixth transistor having a first terminal coupled to the gate terminal of the first transistor, a second terminal coupled to ground, and a gate terminal coupled to the first node.

22. The apparatus of claim 19 wherein the first TAD further comprises:
   a precharge transistor for precharging the net to logic level one, the precharge transistor having a first terminal coupled to the first supply voltage source, a second terminal coupled to the net, and a gate terminal for receiving the precharge clock signal.

23. The apparatus of claim 14 wherein the first TAD is capable of pulling the first node to logic level one and comprises:
   a first pull-up transistor having a first terminal coupled to a first supply voltage source, a second terminal, and a gate terminal capable of receiving a precharge clock signal;
   a first pull-down transistor having a first terminal coupled to the second terminal of the first pull-up transistor, a second terminal, and a gate terminal coupled to the first node;
   a second pull-down transistor having a first terminal coupled to the second terminal of the first pull-down transistor, a second terminal coupled to ground, and a gate terminal for receiving the precharge clock signal; and
   a second pull-up transistor having a first terminal coupled to the first supply voltage source, a second terminal coupled to the first node, and a gate terminal coupled to the second terminal of the first pull-up transistor.

24. The apparatus of claim 23 wherein the first TAD further comprises:
   a third pull-up transistor having a first terminal coupled to the first supply voltage source, a second terminal coupled to the second terminal of the first pull-up transistor, and a gate terminal that can be coupled to the first node and, alternatively, to ground.

25. The apparatus of claim 23 wherein the first TAD further comprises:
   a fourth pull-up transistor having a first terminal coupled to the first supply voltage source, a second terminal coupled to the second terminal of the first pull-up transistor, and a gate terminal coupled to the first node.

26. The apparatus of claim 23 wherein the first TAD further comprises:
   a precharge transistor for precharging the net to logic level zero, the precharge transistor having a first terminal coupled to the net, a second terminal coupled to ground, and a gate terminal for receiving an inverse of the precharge clock signal.

27. The apparatus of claim 14 further comprising a second TAD coupled to the net at a second node and capable of pulling the voltage level of the second node in response to the voltage level of the second node reaching the threshold value.

28. An apparatus for transmitting a signal across a net in an integrated circuit including a first node, the apparatus comprising:
   a driver, coupled to the net, for driving the signal across the net;
   a first transition assist driver (TAD) coupled to the first node in the net and capable of pulling the voltage level of the first node in response to the voltage level of the first node reaching a threshold value;
   wherein the first TAD pulls the first node to logic level zero if the net is precharged to logic level one.

29. An apparatus for transmitting a signal across a net in an integrated circuit including a first node, the apparatus comprising:
   a driver, coupled to the net, for driving the signal across the net;
   a first transition assist driver (TAD) coupled to the first node in the net and capable of pulling the voltage level of the first node in response to the voltage level of the first node reaching a threshold value;
   wherein the first TAD pulls the first node to logic level one if the net is precharged to logic level zero.

30. An apparatus for high speed signal propagation in an integrated circuit, comprising:
   a net for transmitting signals in the integrated circuit, the net having a first node; and
   a first transition assist driver (TAD) coupled to a first node and capable of pulling the voltage level of the first node in response to the voltage level of the first node reaching a threshold value;
   wherein the first TAD pulls the first node to logic level zero if the net is precharged to logic level one.

31. A method for high speed signal propagation in an integrated circuit by use of a signal propagation system including a net, the net including a first node, the method comprising:
   precharging the first node to a first logic state;
   sensing a voltage level of the first node; and
   pulling the voltage level of the first node in response to the voltage level of the first node reaching a threshold value, wherein the first node is pulled to a second logic state in response to the voltage level of the first node reaching the threshold value.

32. The method of claim 31 wherein the voltage level of the first node is pulled to logic level zero during the pulling step (b) if the net is precharged to logic level one.

33. The method of claim 31 wherein the voltage level of the first node is pulled to logic level one during the pulling step (b) if the net is precharged to logic level zero.

34. The method of claim 31 wherein the pulling step (b) comprises:
setting the threshold value of step (b) at a selected level to compromise between faster switching speed and increased noise immunity for the signal propagation system.

35. The method of claim 31 wherein the pulling step (b) comprises:
pulling the voltage level of the first node while a first signal transmits in a first direction across the net.

36. The method of claim 31 wherein the pulling step (b) comprises:
pulling the voltage level of the first node while a second signal transmits in a second direction across the net.

37. The method of claim 31 further comprising the step of:
pulling the voltage level of a second node in the net in response to a voltage level of the second node reaching a threshold value.

38. The method of claim 31 further comprising the step of:
precharging the voltage levels of at least two neighboring nets in the integrated circuit to avoid opposite switching between signals in the neighboring nets.

39. A method of achieving high speed propagation for a signal across a net in an integrated circuit, the net including a first node, the method comprising:
precharging the first node to a first logic state;
driving a signal across the first node in the net; and
pulling the voltage level of the first node if the voltage level of the first node reaches a threshold value as the signal approaches the first node, wherein the first node is pulled to a second logic state in response to the voltage level of the first node reaching the threshold value.

40. The method of claim 39 further comprising the step of:
pulling the voltage level of a second node in the net if the voltage level across the second node reaches the threshold value as the signal approaches the second node.

41. The method of claim 39 further comprising the step of:
precharging the voltage levels of at least two neighboring nets in the integrated circuit to avoid opposite switching between signals in the neighboring nets.

42. The method of claim 39 further comprising the step of:
setting the threshold value of step (b) to adjust the noise immunity of the integrated circuit.

43. An apparatus for high speed propagation of a signal across a net in an integrated circuit, the net including a first node, the apparatus comprising:
means, coupled to the net, for driving the signal across the net; and
first means, coupled to the net, for pulling the voltage level of the first node in response to the voltage level of the first node reaching a threshold value, wherein the first node is precharged to a first logic state, the first pulling means pulling the first node to a second logic state in response to the voltage level of the first node reaching the threshold value.

44. The apparatus of claim 43 further comprising:
second means, coupled to the net, for pulling the voltage level of a second node in response to the voltage level of the second node reaching the threshold value.

45. A driver for pulling the voltage level of a net including a first node, the driver comprising:

a first pulling circuit having an input terminal coupled to the first node, a first terminal coupled to a first voltage potential, a second terminal coupled to a second voltage potential, and an output terminal, the first pulling circuit configured to turn on in response to the voltage level at the first node attaining a threshold value; and
a second pulling circuit having an input terminal coupled to the output terminal of the first pulling circuit, a first terminal coupled to the first node, and a second terminal coupled to the second voltage potential, the second pulling circuit pulling the first node to the second voltage potential in response to the first pulling circuit turning on.

46. The driver of claim 45 further comprising:
a precharge transistor having a first terminal coupled to the first voltage potential, a second terminal coupled to the net, and a gate terminal for receiving a clock signal.

47. he driver of claim 45 further comprising:
a fifth transistor having a first terminal coupled to the input terminal of the second pulling circuit, a second terminal coupled to the second voltage potential, and a gate terminal coupled to the first node and, alternatively, to the second voltage potential.

48. The driver of claim 45 wherein the second pulling circuit comprises:
a first transistor having a first terminal coupled to the first node, a second terminal coupled to the second voltage potential, and a gate terminal coupled to the output terminal of the first pulling circuit.

49. The driver of claim 45 wherein the first pulling circuit comprises:
a second transistor having a first terminal coupled to the first voltage potential, a second terminal, and a gate terminal for receiving an inverted clock signal;
a third transistor having a first terminal coupled to the second terminal of the second transistor, a second terminal coupled to the input terminal of the second pulling circuit, and a gate terminal coupled to the first node; and
a fourth transistor having a first terminal coupled to the second terminal of the third transistor, a second terminal coupled to the second voltage potential, and a gate terminal for receiving the inverted clock signal.

50. A driver for pulling the voltage level of a net including a first node, the driver comprising:
a first pulling circuit having an input terminal coupled to the first node, a first terminal coupled to a first voltage potential, a second terminal coupled to a second voltage potential, and an output terminal, the first pulling circuit configured to turn on in response to the voltage level at the first node attaining a threshold value; and
a second pulling circuit having an input terminal coupled to the output terminal of the first pulling circuit, a first terminal coupled to the first voltage potential, and a second terminal coupled to the first node, the second pulling circuit pulling the first node to the first voltage potential in response to the first pulling circuit turning on.

51. The driver of claim 50 further comprising:
a fifth transistor having a first terminal coupled to the first voltage potential, a second terminal coupled to the input terminal of the second pulling circuit, and a gate terminal coupled to the first node and, alternatively, to the second voltage potential.

52. The driver of claim 50 wherein the second pulling circuit comprises:

a first transistor having a first terminal coupled to the first voltage potential, a second terminal coupled to the first node, and a gate terminal coupled to the output terminal of the first pulling circuit.

53. The driver of claim 50 wherein the first pulling circuit comprises:

a second transistor having a first terminal coupled to the first voltage potential, a second terminal, and a gate terminal for receiving a clock signal;

a third transistor having a first terminal coupled to the second terminal of the second transistor, a second terminal coupled to the input terminal of the second pulling circuit, and a gate terminal coupled to the first node; and a fourth transistor having a first terminal coupled to the second terminal of the third transistor, a second terminal coupled to the second voltage potential, and a gate terminal for receiving the clock signal.

54. The driver of claim 50 further comprising:

a precharge transistor having a first terminal coupled to the net, a second terminal coupled to the second voltage potential, and a gate terminal for receiving the clock signal.

55. An apparatus for high speed signal propagation in an integrated circuit, comprising:

a net for transmitting signals in the integrated circuit, the net having a first node; and a first transition assist driver (TAD) coupled to a first node and capable of pulling the voltage level of the first node in response to the voltage level of the first node reaching a threshold value;

wherein the first TAD pulls the first node to logic level one if the net is recharged to logic level zero.

56. A method for high speed signal propagation in an integrated circuit by use of a signal propagation system including a net, the net including a first node, the method comprising:

sensing a voltage level of the first node; and pulling the voltage level of the first node in response to the voltage level of the first node reaching a threshold value;

wherein the voltage level of the first node is pulled to logic level zero during the pulling step if the net is precharged to logic level one.

57. A method for high speed signal propagation in an integrated circuit by use of a signal propagation system including a net, the net including a first node, the method comprising:

sensing a voltage level of the first node; and pulling the voltage level of the first node in response to the voltage level of the first node reaching a threshold value;

wherein the voltage level of the first node is pulled to logic level one during the pulling step if the net is precharged to logic level zero.

58. A method for high speed signal propagation in an integrated circuit by use of a signal propagation system including a net, the net including a first node, the method comprising:

sensing a voltage level of the first node;

pulling the voltage level of the first node in response to the voltage level of the first node reaching a threshold value; and recharging the voltage levels of at least two neighboring nets in the integrated circuit to avoid opposite switching between signals in the neighboring nets.

59. A method of achieving high speed propagation for a signal across a net in an integrated circuit, the net including a first node, the method comprising:

driving a signal across the first node in the net;

pulling the voltage level of the first node if the voltage level of the first node reaches a threshold value as the signal approaches the first node; and precharging the voltage levels of at least two neighboring nets in the integrated circuit to avoid opposite switching between signals in the neighboring nets.

* * * * *

UNITED STATES PATENT AND TRADEMARK OFFICE
CERTIFICATE OF CORRECTION

PATENT NO. : 6,249,147 B1
DATED : June 19, 2001
INVENTOR(S) : Vinh et al.

It is certified that error appears in the above-identified patent and that said Letters Patent is hereby corrected as shown below:

<u>Column 16,</u>
Line 18, delete "he" and replace with -- The --.

<u>Column 17,</u>
Line 33, delete "recharged" and replace with -- precharged --.

<u>Column 18,</u>
Line 27, delete "recharging" and replace with -- precharging --.

Signed and Sealed this

Twenty-fifth Day of December, 2001

Attest:

*Attesting Officer*

JAMES E. ROGAN
*Director of the United States Patent and Trademark Office*